United States Patent
Kameyama et al.

(10) Patent No.: US 7,241,679 B2
(45) Date of Patent: Jul. 10, 2007

(54) METHOD OF MANUFACTURING SEMICONDUCTOR DEVICE

(75) Inventors: Koujiro Kameyama, Ota (JP); Akira Suzuki, Ota (JP); Yoshio Okayama, Brookline, MA (US)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/057,413

(22) Filed: Feb. 15, 2005

(65) Prior Publication Data

US 2005/0196957 A1   Sep. 8, 2005

(30) Foreign Application Priority Data

Feb. 17, 2004   (JP) .............................. 2004-040299

(51) Int. Cl.
    *H01L 21/44*   (2006.01)
(52) U.S. Cl. ...................... 438/612; 438/700; 438/701; 257/E23.069
(58) Field of Classification Search ................ 438/571, 438/575, 582, 618, 622, 624, 625, 627, 628, 438/634, 637, 648, 656, 660, 683, 685, 686–689, 438/706, 708–719, 694, 700, 701, 704, 723, 438/612–614; 738/710; 257/E23.069
See application file for complete search history.

(56) References Cited

U.S. PATENT DOCUMENTS

| | | | | |
|---|---|---|---|---|
| 4,381,341 A | | 4/1983 | Przybysz et al. | |
| 4,473,435 A | * | 9/1984 | Zafiropoulo et al. | 438/719 |
| 4,560,436 A | * | 12/1985 | Bukhman et al. | 438/701 |
| 4,726,879 A | * | 2/1988 | Bondur et al. | 438/712 |
| 5,236,854 A | | 8/1993 | Higaki et al. | |
| 6,468,889 B1 | | 10/2002 | Iacoponi et al. | |
| 2002/0070457 A1 | * | 6/2002 | Sun et al. | 257/774 |

FOREIGN PATENT DOCUMENTS

| | | |
|---|---|---|
| EP | 1376678 A | 1/2004 |
| JP | 2002-512436 A | 4/2002 |
| WO | WO-99-40624 A1 | 8/1999 |

* cited by examiner

*Primary Examiner*—Brook Kebede
(74) *Attorney, Agent, or Firm*—Morrison & Foerster LLP

(57) ABSTRACT

This invention provides an etching method for preventing deformation of an opening without extremely lowering productivity. This invention has a process for bonding a supporting board on a front surface of a semiconductor substrate to cover a pad electrode formed on the semiconductor substrate with a silicon oxide film interposed therebetween, a process for forming a via hole from a back surface of the semiconductor substrate to a surface of the pad electrode, a process for forming a first opening in the semiconductor substrate to a position where the silicon oxide film is not exposed with using etching gas containing $SF_6$ and $O_2$ at least, and a process for forming a second opening in the semiconductor substrate to a position where the silicon oxide film is exposed with using etching gas containing $C_4F_8$ and $SF_6$ at least.

13 Claims, 5 Drawing Sheets

METHOD OF MANUFACTURING SEMICONDUCTOR DEVICE

CROSS-REFERENCE OF THE INVENTION

This invention is based on Japanese Patent Application No. 2004-40299, the content of which is incorporated by reference in its entirety.

BACKGROUND OF THE INVENTION

1. Field of the Invention

This invention relates to a semiconductor device manufacturing method, particularly to an etching method for preventing deformation of a via hole formed in a semiconductor substrate.

2. Description of the Related Art

CSP (Chip Size Package) has received attention in recent years as a three-dimensional mounting technology as well as a new packaging technology. The CSP means a small package having almost same outside dimensions as those of a semiconductor die packaged in it.

Conventionally, BGA (Ball Grid Array) type semiconductor device has been known as a kind of CSP. In this BGA type semiconductor device, a plurality of ball-shaped conductive terminals made of metal such as solder is arrayed in a grid pattern on one surface of the package, and electrically connected with the semiconductor die mounted on the other side of the package.

When this BGA type semiconductor device is mounted on electronic equipment, the semiconductor die is electrically connected with an external circuit on a printed circuit board by compression bonding of the ball-shaped conductive terminals to wiring patterns on the printed circuit board.

Such a BGA type semiconductor device has advantages in providing a large number of conductive terminals and in reducing size over other CSP type semiconductor devices such as SOP (Small Outline Package) and QFP (Quad Flat Package), which have lead pins protruding from their sides. The BGA type semiconductor device is used as an image sensor chip for a digital camera incorporated into a mobile telephone, for example. In some BGA type semiconductor devices, a supporting board made of, for example, a glass is bonded on a surface or both surfaces of the semiconductor die. The technology mentioned above is disclosed, for example, in the Japanese Patent Application Publication No. 2002-512436.

Next, description will be made on the BGA type semiconductor device manufacturing method in a case where a sheet of supporting board is bonded to the semiconductor die, with reference to the drawings.

FIGS. 7 to 9 are cross-sectional views of the BGA type semiconductor device manufacturing method of the conventional art, which is applicable to the image sensor chip.

First, as shown in FIG. 7, a pad electrode 32 made of an aluminum layer or an aluminum alloy layer is formed on a top surface of a semiconductor substrate 30 with a silicon oxide film 31 or a silicon nitride film interposed therebetween. Then, a supporting board 34 made of, for example, a glass is further bonded on the top surface of the semiconductor substrate 30 including the pad electrode 32 with an adhesive 33 made of an epoxy resin layer interposed therebetween.

Next, as shown in FIG. 8, a resist layer 35 is formed on a back surface of the semiconductor substrate 30, having an opening in a position corresponding to the pad electrode 32. Then, the semiconductor substrate 30 is dry-etched using this resist layer 35 as a mask, and the silicon oxide film 31 is further etched, thereby forming a via hole 36 from the back surface of the semiconductor substrate 30 to the pad electrode 32. This process employs an etching method having relatively high process speed for forming an opening having 130 µm depth, for example, in the semiconductor substrate 30 made of a Si wafer (e.g., an etching rate is 10 µm/min).

Then, as shown in FIG. 9, a barrier layer 37 is formed on the back surface of the semiconductor substrate 30, including inside the via hole 36 with an insulation film (not shown) and a surface of the pad electrode 32 A seed layer for plating 38 is formed on the barrier layer 37, and plating is performed to this seed layer 38 to form a re-distribution layer 39 made of, for example, copper (Cu). Furthermore, a protection layer (not shown) is formed on the re-distribution layer 39, and openings are formed in predetermined positions of the protection layer. Then, ball-shaped terminals 40 are formed in the openings, being contact with the re-distribution layer 39.

Then, although not shown, the semiconductor substrate and the layers laminated thereon are cut off and separated into individual semiconductor dice. In this way, the BGA type semiconductor device where the pad electrode 32 and the ball-shaped terminals 40 are electrically connected with each other is formed.

However, the forming process of the via hole 36 described above causes a problem such as deformation of the opening. That is, an etching shape shown in FIG. 10 is formed in the process shown in FIG. 8. Since the pad electrode 32 is formed on the semiconductor substrate 30 with the silicon oxide film 31 or the silicon nitride film interposed therebetween, when the via hole 36 is formed by etching from the back surface of the semiconductor substrate 31 to the pad electrode 32, the etching stops at the silicon oxide film 31 or the silicon nitride film at a bottom of the via hole. Then, when over-etching occurs, the etching proceeds in a lateral direction (notch is formed), thereby deforming the opening as shown in FIG. 10. This notch causes the silicon oxide film 31 or the silicon nitride film to be removed beyond the area of the surface of the pad electrode 32. Furthermore, the adhesion of the insulation film or the re-distribution layer to the via hole 36a having such a shape is degraded, thereby causing a conductive error and lowering reliability in connection with the pad electrode.

Although there is an etching process forming no notch, this process has a disadvantage of extremely low process speed (e.g. an etching rate is 5 µm/min or lower, or 2 to 1 µm/min in some cases). Therefore, this etching process can not be employed because of low productivity.

SUMMARY OF THE INVENTION

The invention provides a method of manufacturing a semiconductor device. The method includes providing a semiconductor substrate having an insulation film formed on the top surface of the semiconductor substrate and a pad electrode disposed on the insulation film, bonding a supporting member to the top surface of a semiconductor substrate so as to cover the pad electrode, performing a first etching from a back surface of the semiconductor substrate to form an opening in the semiconductor substrate using an etching gas comprising $SF_6$ and $O_2$ so that part of the semiconductor substrate remains at a bottom portion of the opening, and performing a second etching to remove the part of the semiconductor substrate remaining at the bottom portion of the opening using an etching gas comprising $SF_6$ and a fluorocarbon-based gas so that the insulation film is exposed.

The invention also provides another method of manufacturing a semiconductor device. The method includes providing a semiconductor substrate comprising an insulation film formed on the top surface of the semiconductor substrate and a pad electrode disposed on the insulation film, bonding a supporting member to the top surface of a semiconductor substrate so as to cover the pad electrode, performing a first etching under an application of a first alternating electric filed from a back surface of the semiconductor substrate to form an opening in the semiconductor substrate so that part of the semiconductor substrate remains at a bottom portion of the opening, and performing a second etching under an application of a second alternating electric filed to remove the part of the semiconductor substrate remaining at the bottom portion of the opening so that the insulation film is exposed. The second alternating electric filed has a lower frequency than the first alternating electric filed.

The invention further provides other method of manufacturing a semiconductor device. The method includes providing a semiconductor substrate comprising an insulation film formed on the top surface of the semiconductor substrate and a pad electrode disposed on the insulation film, bonding a supporting member to the top surface of a semiconductor substrate so as to cover the pad electrode, performing a first etching under an application of an alternating electric filed from a back surface of the semiconductor substrate to form an opening in the semiconductor substrate so that part of the semiconductor substrate remains at a bottom portion of the opening, and performing a second etching under an application of the alternating electric filed to remove the part of the semiconductor substrate remaining at the bottom portion of the opening so that the insulation film is exposed. The total activation time of the alternating electric filed during the second etching is shorter than the total activation time of the alternating electric filed during the first etching.

DESCRIPTION OF THE PREFERRED EMBODIMENT

A method of manufacturing a semiconductor device of an embodiment of the invention will be described with reference to FIGS. 1 to 6. FIGS. 1 to 6 are cross-sectional views of device intermediates at process steps of manufacturing a BGA type semiconductor device, which is applicable to an image sensor chip, of this embodiment.

Figure 1:
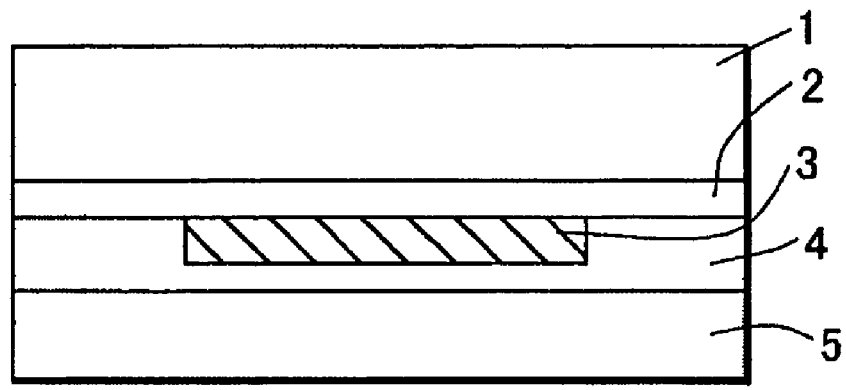
FIG. 1 is a cross-sectional view showing a semiconductor device manufacturing method of an embodiment of the invention.

First, as shown in FIG. 1, a pad electrode 3 made of an aluminum layer or an aluminum alloy layer is formed on a top surface of a semiconductor substrate 1 made of silicon with an insulation layer, for example, a silicon oxide film 2 or a silicon nitride film interposed therebetween. Then, a supporting board 5 made of, for example, a glass is bonded to the semiconductor substrate 1 including the pad electrode 3 with an adhesive 4 made of an epoxy resin layer interposed therebetween. A tape-shaped protective material may be bonded to the semiconductor substrate 1 instead of the supporting board 5. The pad electrode 3 is covered with a passivation film made of silicon nitride film, for example.

Next, a resist layer 6 is formed on a back surface of the semiconductor substrate 1, having an opening in a position corresponding to the pad electrode 3. Then, dry-etching is performed to the semiconductor substrate 1 with using the resist layer 6 as a mask to form a via hole 9 from the back surface of the semiconductor substrate 1 to the pad electrode 3.

Figure 2:
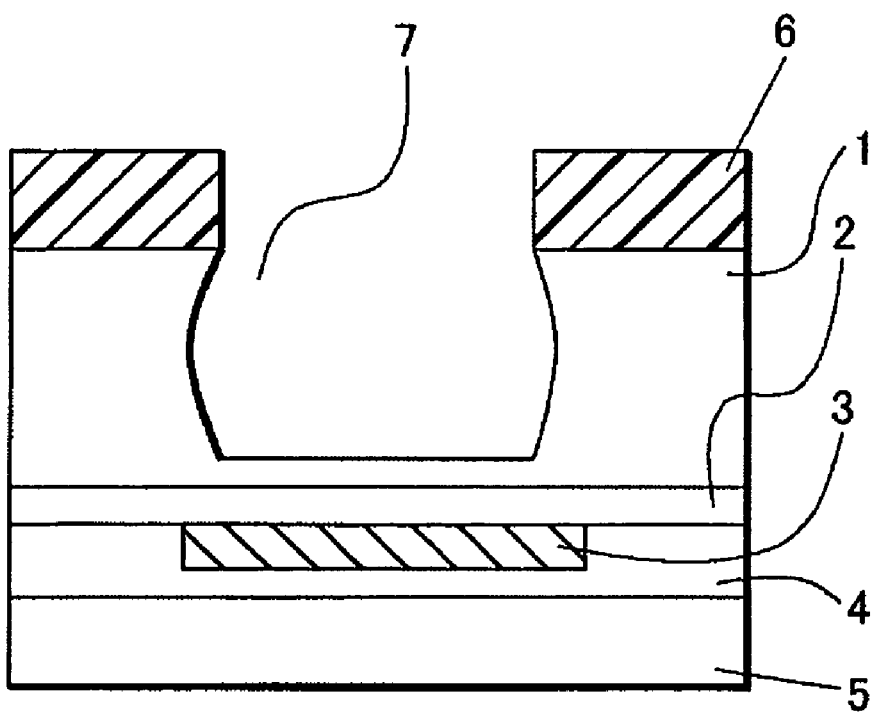
FIG. 2 is a cross-sectional view showing the semiconductor device manufacturing method of the embodiment of the invention.
Figure 8:
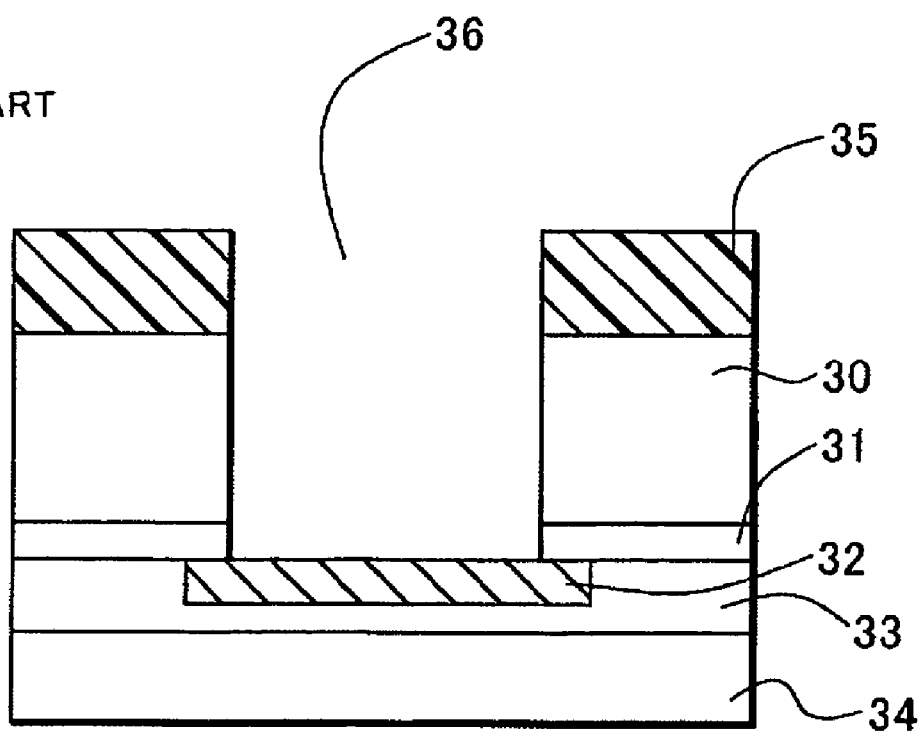
FIG. 8 is a cross-sectional view showing the semiconductor device manufacturing method of the conventional art.
Figure 9:
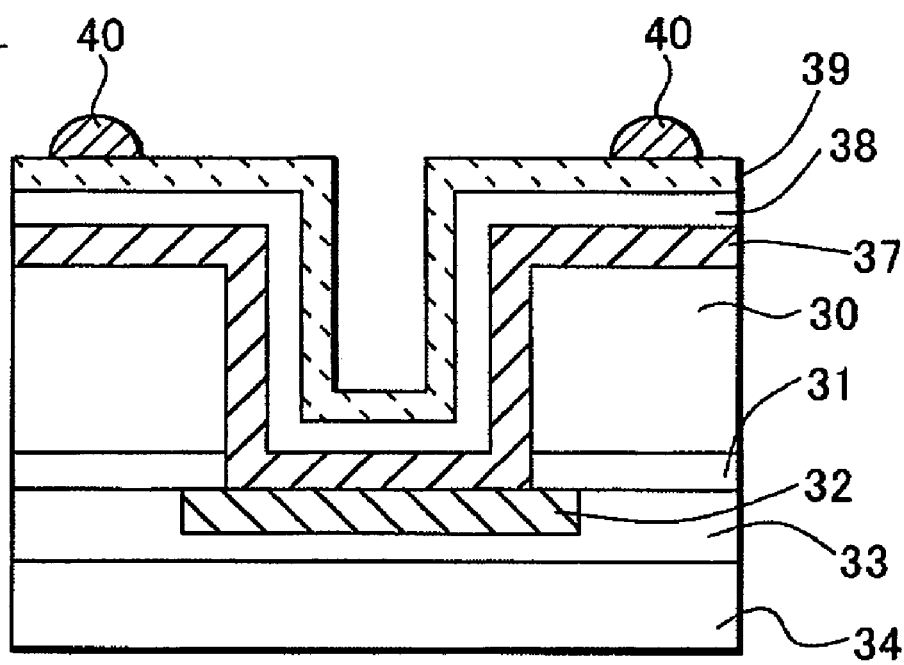
FIG. 9 is a cross-sectional view showing the semiconductor device manufacturing method of the conventional art.
Figure 10:
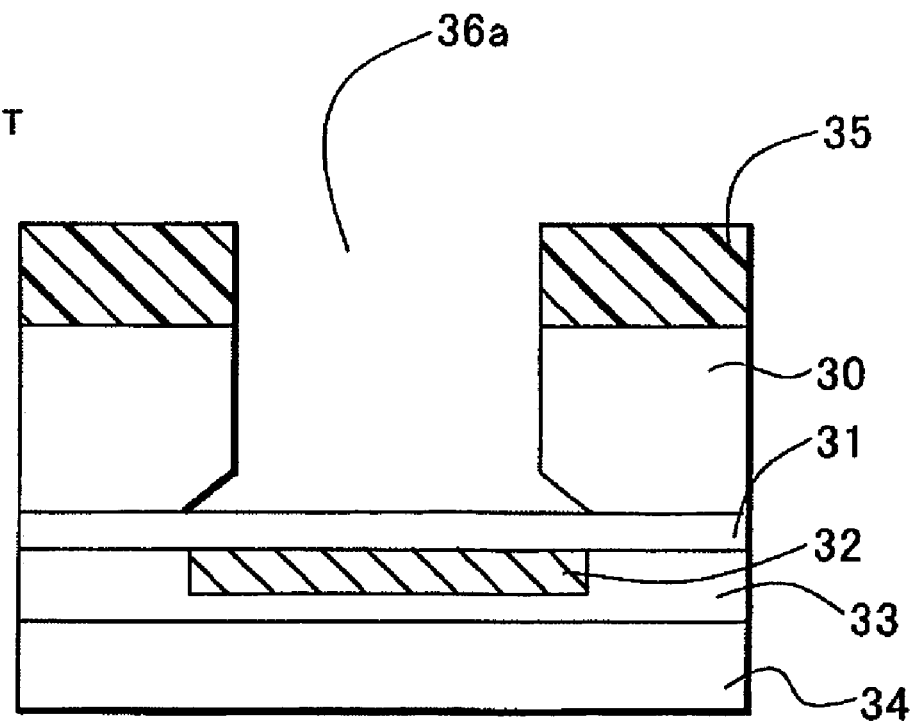
FIG. 10 is a view for describing a problem of the semiconductor device manufacturing method of the conventional art.

First, by a first etching process, a high speed etching is performed until reaching a predetermined depth of the opening, as shown in FIG. 2. When an opening having 130 µm total depth is to be formed for example, a first opening 7 having 120 µm depth is formed by this first etching with using etching gas containing $SF_6$ gas and $O_2$ gas at least. An etching rate in this process is about 10 µm/min, for example. Although the first opening 7 is formed to expand in a lateral direction, forming a barrel-like shape in FIG. 2, it may be of a straight shape, such as the one shown in FIG. 8.

Figure 3:
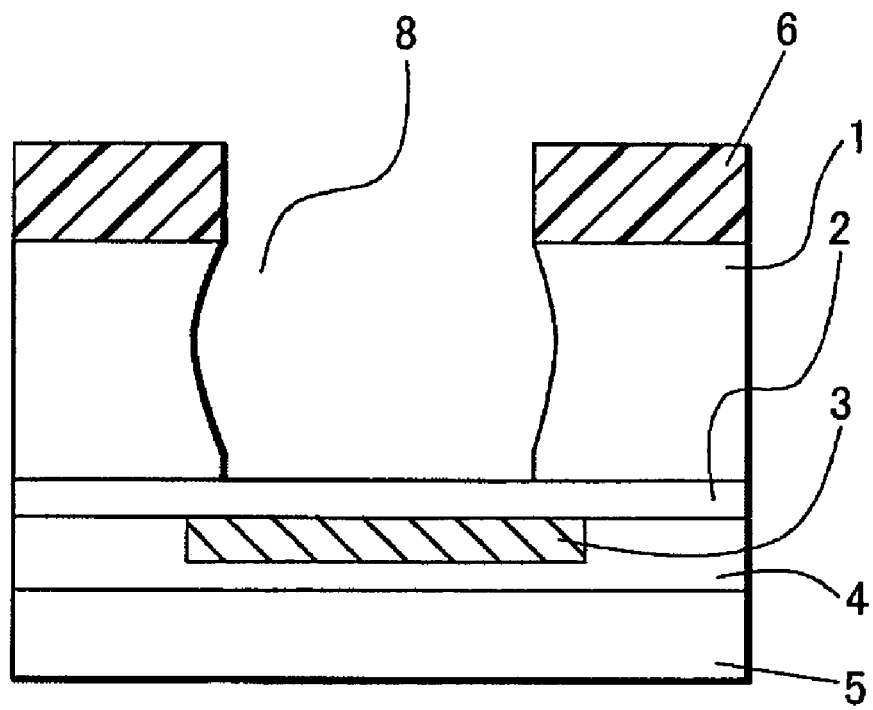
FIG. 3 is a cross-sectional view showing the semiconductor device manufacturing method of the embodiment of the invention.

Then, as shown in FIG. 3, a second etching process is performed until reaching a remaining depth of the opening. In this process, a second opening 8 is formed by etching the semiconductor substrate by a remaining amount of 10 µm depth under the first opening 7 with using etching gas containing $SF_6$ and CF-based gas (e.g. $C_2F_4$, $C_4F_8$, $CHF_3$, and so on) at least. An etching rate in this process is about 5 µm/min, for example, or 2 to 1 µm/min in some cases. Both the first and second etching gas can contain diluted gas and so on such as Ar, for example.

Accordingly, this embodiment has two processes for forming the opening having 130 µm total depth in a Si wafer. The first opening 7 is formed by performing the first etching under the condition of the high etching rate, and then the second opening 8 is formed by performing the second etching under the condition of the low etching rate. This prevents working time from extremely increasing. In this embodiment, the opening is formed by changing the etching gas in the same chamber. However, the opening can be formed by changing the chamber in the same etching device having a plurality of chambers or by changing the etching device in each of the etching processes.

Figure 4:
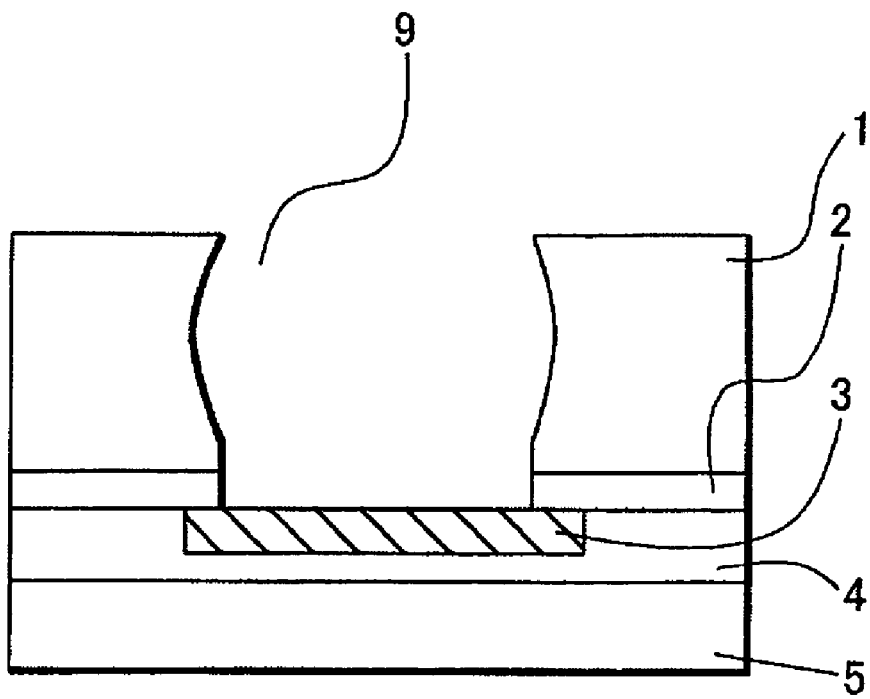
FIG. 4 is a cross-sectional view showing the semiconductor device manufacturing method of the embodiment of the invention.

Then, as shown in FIG. 4, the silicon oxide film 2 on the pad electrode 3 is removed by dry etching using an etching gas including fluorocarbon such as $CHF_3$ or $CF_4$ diluted with argon, for example, or wet etching to form a via hole 9 exposing the pad electrode 3.

In the process of removing the silicon oxide film 2 by etching, the resist layer 6 formed on the semiconductor substrate 1 can be used as a mask for removing the silicon oxide film 2 on the pad electrode 3. Alternatively, the resist layer 6 may not be used as a mask, that is, after the resist layer 6 is removed, the semiconductor substrate 1 can be used as a mask for removing the silicon oxide film 2 on the pad electrode 3.

Figure 5:
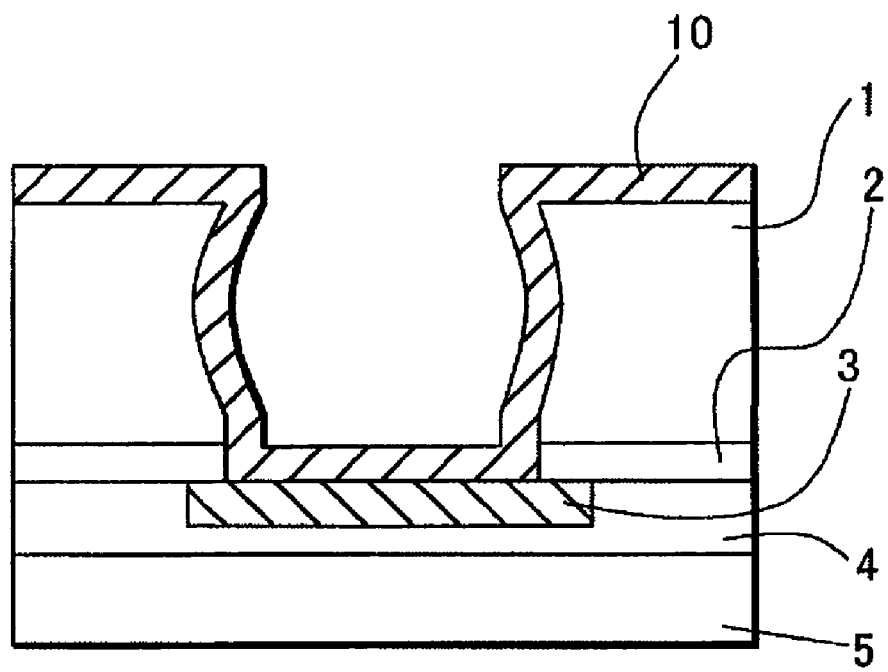
FIG. 5 is a cross-sectional view showing the semiconductor device manufacturing method of the embodiment of the invention.

Then, as shown in FIG. 5, an insulation layer (not shown) made of an oxide film is formed on the back surface of the semiconductor substrate 1 including inside the via hole 9, the insulation layer on the pad electrode 3 is removed, and then a barrier layer 10 is formed on the whole surface. It is preferable that the barrier layer 10 is a titanium nitride (TiN) layer, for example. Alternatively, the barrier layer 10 may be made of a metal layer other than the titanium nitride layer as long as the metal layer is made of metal having a high melting point such as titanium (Ti) or tantalum (Ta) or a compound of metal having a high melting point such as titanium tungsten (TiW), tantalum nitride (TaN), and so on.

Figure 6:
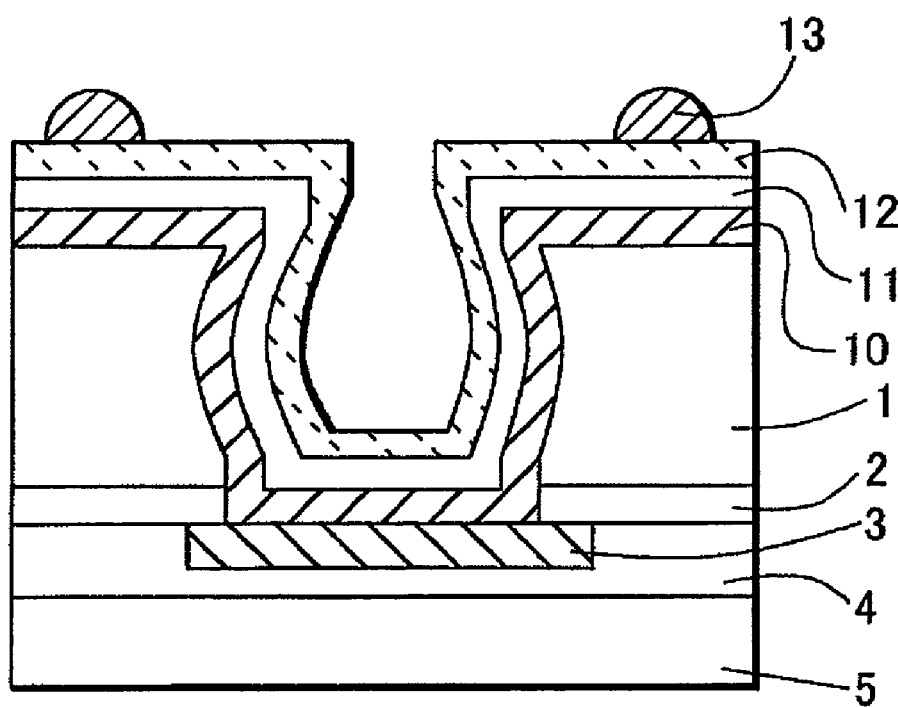
FIG. 6 is a cross-sectional view showing the semiconductor device manufacturing. method of the embodiment of the invention.
Figure 7:
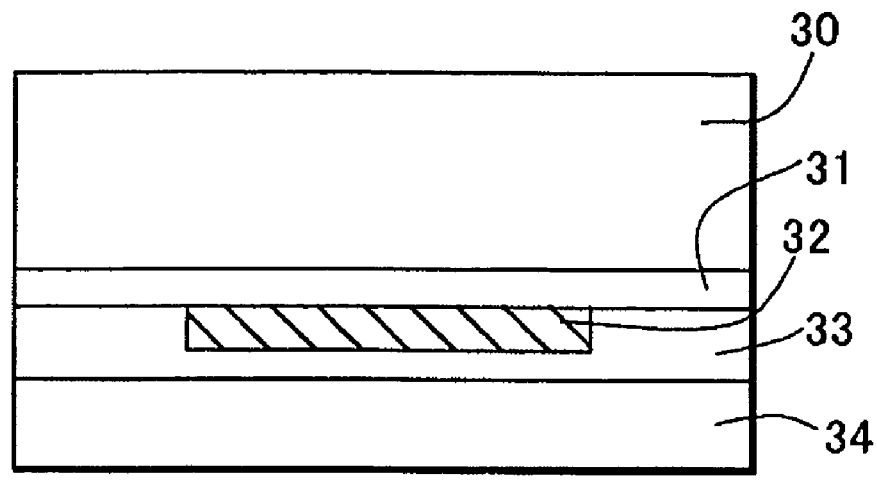
FIG. 7 is a cross-sectional view showing a semiconductor device manufacturing method of the conventional art.

Furthermore, a seed layer for plating 11 (e.g., made of a Cu layer) is formed on the barrier layer 10 as shown in FIG. 6, and plating is performed to the seed layer 11 to form a re-distribution layer 12 made of, for example, copper (Cu). This re-distribution layer 12 can be patterned or not be patterned. Then, a protection layer (not shown) is formed on the re-distribution layer 12, openings are formed in predetermined positions of the protection layer, and ball-shaped terminals 13 are formed in the openings, being contact with the re-distribution layer 12.

Here, although a MOCVD method can be used as a forming method of the barrier layer 10 or the seed layer 11, but this method has a problem of high cost. Therefore, a directional sputtering method such as a long throw sputtering method which costs less can be used, and this method can improve coverage compared with the ordinary sputtering method. This directional sputtering method can form the barrier layer 10 or the seed layer 11 with excellent coverage even in the via hole having an inclination less than 90 degrees or having an aspect ratio more than 3, for example.

Then, although not shown, the semiconductor substrate and the layers laminated thereon are cut off and separated into individual semiconductor dice. The BGA type semiconductor device where the pad electrode 3 and the ball-shaped terminals 13 are electrically connected with each other is thus manufactured.

In this invention, the etching in the lateral direction (notch formation) at the bottom of the opening such as occurs in the conventional art does not occur. Therefore, the problem of low bondability of the insulation film, the barrier layer, the seed layer, and the re-distribution layer to the inside of the via hole does not occur. This prevents conductive errors from occurring and reliability in connection with the pad electrode from lowering.

Furthermore, although the first opening 7 and the second opening 8 are formed by changing the etching gas in this embodiment, modifications are possible. For example, between the first etching process for forming the first opening 7 and the second etching process for forming the second opening 8, the frequency of an alternating voltage applied to the semiconductor substrate 1 in the second etching process can be set lower than in the first etching process.

In the first and second etching processes, an inductively coupled plasma etching machine is used as a dry-etching machine, for example. The semiconductor substrate 1 is set on a table applied with the alternating voltage from an alternator. The frequency of the alternating voltage is set at 13.56 MHz in the first etching process and at 400 KHz in the second etching process, so that the etching rate is reduced in the second etching process to prevent the notch such as occurs in the conventional art.

The notch formation can be prevented by setting the application time of the alternating voltage in the second etching process shorter than in the first etching process instead of changing the frequency of the alternating voltage described above. That is, in the first and second etching processes, the alternator is controlled to turn ON intermittently, so that the alternating voltage can be applied to the semiconductor substrate 1 intermittently. Thus, when the alternator is ON, the alternating voltage is applied to the semiconductor substrate 1, thereby occurring plasma in the etching device. When the alternator is OFF, the alternating voltage is not applied to the semiconductor substrate 1, thereby stopping the plasma occurring. The ON and OFF operations of the alternator is repeated cyclically. For example, suppose that the application time of the alternating voltage in the first etching process is 100%, the application time in the second etching process is set lower, i.e. at 10%. Thus, the etching rate in the second etching process is lower than in the first etching process, thereby preventing the notch formation occurring in the conventional art.

In the second and third embodiments, the etching gas is not changed in the first and second etching processes. However, the frequency of the alternating voltage can be changed or the application time of the alternating voltage can be adjusted, as well as the change of the etching gas.

Although the re-distribution layer 12 is formed by plating in this embodiment, the re-distribution layer 12 can be formed by other methods than plating without forming the seed layer for plating 11. For example, a layer made of aluminum or aluminum alloy can be formed by sputtering, for example.

The embodiments are described as applicable to the semiconductor device having the ball-shaped terminals 13. However, the embodiments can be applied to the semiconductor device having no ball-shaped terminal as long as the semiconductor device has the via hole penetrating through the semiconductor substrate, for example, an LGA (Land Grid Array) type semiconductor device.

What is claimed is:

1. A method of manufacturing a semiconductor device, comprising:

providing a semiconductor substrate comprising an insulation film formed on a top surface of the semiconductor substrate and a pad electrode disposed on the insulation film;

bonding a supporting member to the top surface of a semiconductor substrate so as to cover the pad electrode;

performing a first etching from a back surface of the semiconductor substrate to form an opening in the semiconductor substrate using an etching gas comprising $SF_6$ and $O_2$ so that part of the semiconductor substrate remains at a bottom portion of the opening; and performing a second etching to remove the part of the semiconductor substrate remaining at the bottom portion of the opening using an etching gas comprising $SF_6$ and a fluorocarbon-based gas so that the insulation film is exposed.

2. A method of manufacturing a semiconductor device, comprising:
- providing a semiconductor substrate comprising an insulation film formed on a top surface of the semiconductor substrate and a pad electrode disposed on the insulation film;
- bonding a supporting member to the top surface of a semiconductor substrate so as to cover the pad electrode;
- performing a first etching under an application of a first alternating electric field from a back surface of the semiconductor substrate to form an opening in the semiconductor substrate so that part of the semiconductor substrate remains at a bottom portion of the opening; and
- performing a second etching under an application of a second alternating electric field to remove the part of the semiconductor substrate remaining at the bottom portion of the opening so that the insulation film is exposed, the second alternating electric field having a lower frequency than the first alternating electric field.

3. A method of manufacturing a semiconductor device, comprising:
- providing a semiconductor substrate comprising an insulation film formed on a top surface of the semiconductor substrate and a pad electrode disposed on the insulation film;
- bonding a supporting member to the top surface of a semiconductor substrate so as to cover the pad electrode;
- performing a first etching under an application of an alternating electric field from a back surface of the semiconductor substrate to form an opening in the semiconductor substrate so that part of the semiconductor substrate remains at a bottom portion of the opening; and
- performing a second etching under an application of the alternating electric field to remove the part of the semiconductor substrate remaining at the bottom portion of the opening so that the insulation film is exposed, a total activation time of the alternating electric field during the second etching being shorter than a total activation time of the alternating electric field during the first etching.

4. The method of claim 1, 2 or 3, further comprising performing a third etching to remove the exposed insulation film to form a via hole so that the pad electrode is exposed at a bottom portion of the via hole.

5. The method of claim 4, wherein the insulation film is etched using a resist layer as a mask that is used when the semiconductor substrate is etched.

6. The method of claim 4, wherein the insulation film is etched using the semiconductor substrate from which a resist layer has been removed as a mask.

7. The method of claim 4, further comprising forming a conducting portion in the via hole that is connected to the pad electrode.

8. The method of claim 7, further comprising forming a ball-shaped terminal connected to the conducting portion.

9. The method of claim 8, further comprising forming a wiring layer on the back surface of the semiconductor substrate so that the conducting portion and the ball-shaped portion are connected by the wiring layer.

10. The method of claim 1, 2 or 3, further comprising separating the semiconductor substrate so that individual semiconductor dice are formed.

11. A method of manufacturing a semiconductor device, comprising:
- providing a semiconductor substrate comprising an insulation film formed on a top surface of the semiconductor substrate and a pad electrode disposed on the insulation film;
- performing a first etching from a back surface of the semiconductor substrate to form an opening in the semiconductor substrate using an etching gas comprising $SF_6$ and $O_2$ so that part of the semiconductor substrate remains at a bottom portion of the opening; and
- performing a second etching to remove the part of the semiconductor substrate remaining at the bottom portion of the opening using an etching gas comprising $SF_6$ and a fluorocarbon-based gas so that the insulation film is exposed.

12. The method of claim 11, wherein the first etching is performed under an application of a first alternating electric field, and the second etching is performed under an application of a second alternating electric field that has a lower frequency than the first alternating electric field.

13. The method of claim 11, wherein the first and second etchings are performed under an application of an alternating electric field, and a total activation time of the alternating electric field during the second etching is shorter than a total activation time of the alternating electric field during the first etching.

* * * * *